United States Patent [19]

Braun

[11] Patent Number: 4,634,999

[45] Date of Patent: Jan. 6, 1987

[54] RF OSCILLATOR FREQUENCY STABILIZING CIRCUIT USING SELF-MIXING WITH REFERENCE FREQUENCY

[75] Inventor: Robin M. Braun, Cape Town, South Africa

[73] Assignee: Plessey South Africa Limited, Retreat, South Africa

[21] Appl. No.: 739,694

[22] Filed: May 31, 1985

[30] Foreign Application Priority Data

Jun. 5, 1984 [ZA] South Africa ............... 84/4215

[51] Int. Cl.⁴ .................... H03L 7/12; H03L 7/24
[52] U.S. Cl. ........................ 331/4; 331/10; 331/18; 331/30; 331/36 C; 331/107 DP; 331/177 V
[58] Field of Search ........... 331/1 R, 4, 9, 10, 18, 331/25, 30, 32, 33, 34, 36 C, 96, 107 DP, 107 G, 177 V

[56] References Cited

U.S. PATENT DOCUMENTS

| | | | |
|---|---|---|---|
| 2,972,720 | 2/1961 | Hume | 331/4 |
| 3,886,471 | 5/1975 | Massani et al. | 331/107 DP X |
| 4,206,421 | 6/1980 | Bernhard et al. | 331/36 C X |
| 4,297,648 | 10/1981 | Tucker et al. | 331/1 R |
| 4,342,009 | 7/1982 | Dixon, Jr. | 331/107 DP |

OTHER PUBLICATIONS

"New Modular Concept for Phase Locked RF Oscillators" By: Bernhard et al-(published in the Conference Proceedings of the 11th European Microwave Conference, Sep. 7 to 10, 1981, Amsterdam, paper P11, pp. 584 et seq).

*Primary Examiner*—Siegfried H. Grimm
*Attorney, Agent, or Firm*—Fleit, Jacobson, Cohn & Price

[57] ABSTRACT

A frequency stable RF oscillator 10 comprises a variable frequency RF source in the form of a microwave cavity 24 having a Gunn diode 26 and a varactor 28 mounted therein, and produces an RF output frequency $f_o$. The output of a frequency stable reference oscillator 14 having a frequency $f_r$ is impressed upon the RF source. Through self-mixing action of the Gunn diode, an IF whose frequency is $f_{IF}=|nf_r-f_o|$ is generated, n being a high harmonic number. The IF is detected by an IF amplifier 18 which forms part of a frequency lock loop controlling the frequency of the RF source.

10 Claims, 3 Drawing Figures

4,634,999

RF OSCILLATOR FREQUENCY STABILIZING CIRCUIT USING SELF-MIXING WITH REFERENCE FREQUENCY

BACKGROUND OF THE INVENTION

This invention relates to an RF oscillator, and to a method of generating RF energy.

The generation of frequency stable microwave power presents certain difficulties. This is particularly so at frequencies of above about 2.5 GHz, where the use, in a phase lock loop, of digital frequency dividers coupled directly to the microwave output is no longer practical. The practice heretofore has normally been to use a separate harmonic generator, in the form of a non-linear device such as a snap recovery diode. This is used to generate, from the output of a frequency-stable relatively low frequency reference oscillator, a harmonic having a frequency close to the desired one. The output of the non-linear device is fed to a mixer, where local oscillator bias is provided by the microwave source. The resulting IF (frequency difference between the harmonic and the output of the microwave source) is then used in a control loop to control the frequency of the microwave source. The use of such a separate harmonic generator is expensive.

It is an object of the invention to provide a frequency stable RF oscillator in which use is made of inexpensive components.

SUMMARY OF THE INVENTION

According to the invention there is provided a frequency stable RF oscillator, which comprises:

a variable frequency RF source including an active element which has a non-linear characteristic;

a frequency stable reference oscillator whose output is coupled to the RF source;

IF circuitry having its input coupled to the RF source and being responsive to the difference frequency between the frequency of the RF source and the second or higher harmonic of the frequency of the reference oscillator; and control means operable in response to the IF circuitry to control the frequency of the RF source.

Said active element may be a two-terminal negative resistance device, e.g. a Gunn diode.

Said control means may comprise means for establishing a frequency lock loop. Alternatively, said control means may comprise means for establishing a phase lock loop.

Where the variable frequency RF source comprises a varactor for providing the source with frequency variability, the control means may be operable to control the frequency of the source by controlling the bias of the varactor.

Alternatively, where the RF oscillator comprises a variable power supply for providing said active element with a variable bias, the control means may be operable to control the frequency of the RF source by controlling the bias of said active element.

The RF oscillator may further comprise a signal generator which is operative to superimpose a sweep signal on said bias until the frequency of the RF source is locked to that of the reference oscillator.

The invention extends to a method of generating frequency stable RF energy, which method comprises:

causing a variable frequency RF source to generate RF energy, the RF source including an active element which has a non-linear characteristic;

generating a frequency stable reference signal;

impressing the reference signal on the RF source, thereby to generate an IF signal having a frequency equal to the difference frequency between the frequency of the RF source and the second or higher harmonic of the frequency of the reference oscillator; and utilizing the IF signal to control the frequency of the RF oscillator.

The invention will now be described in more detail, by way of example, with reference to the accompanying drawings.

DETAILED DESCRIPTION

Figure 1:
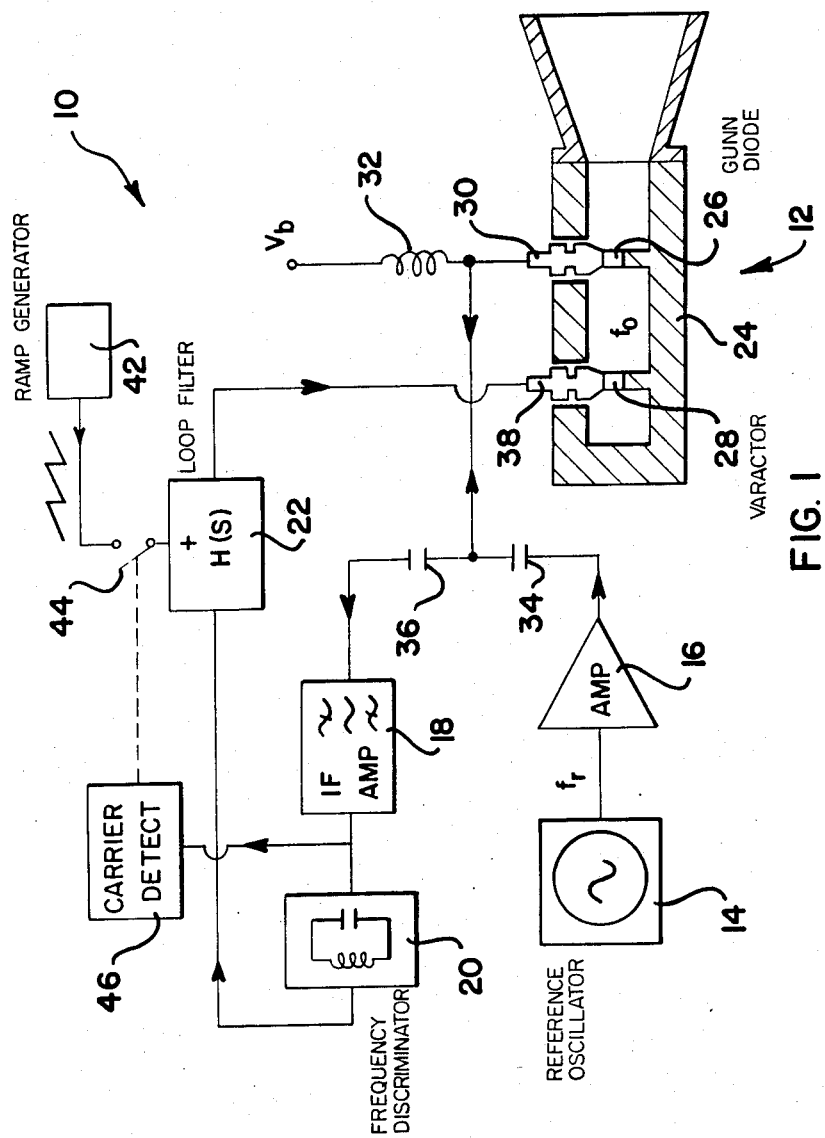
FIG. 1 is a schematic block diagram of a frequency stable microwave oscillator in accordance with the invention.

In FIG. 1, reference numeral 10 generally designates a frequency stable microwave oscillator. The oscillator comprises a variable frequency microwave source 12, a frequency stable (e.g. a crystal controlled) reference oscillator 14, an oscillator amplifier 16, an IF amplifier 18, a frequency discriminator 20, and a loop filter 22. The microwave source 12 comprises a waveguide cavity resonator 24 having a Gunn diode 26 and a varactor 28 mounted therein in conventional manner.

The requisite bias voltage $V_b$ is applied to terminal 30 of the Gunn diode 26, via an inductor 32.

The output of the reference oscillator 14 is connected to the terminal 30 via the amplifier 16 and a coupling capacitor 34. The terminal 30 is in turn connected to the input of the IF amplifier 18 via a coupling capacitor 36. The output of the loop filter 22 is connected to terminal 38 of the varactor 28, the capacitor 36, the IF amplifier 18, the frequency discriminator 20 and the loop filter 22 together forming a frequency lock loop.

Operation of the oscillator 10 is as follows. The application of bias voltage to the Gunn diode 26 causes the microwave source 12 to oscillate at its resonance frequency $f_o$, the output of the reference oscillator 14, whose frequency $f_r$ is substantially lower than the resonance frequency $f_o$, being impressed on the terminal 30.

Figure 2:
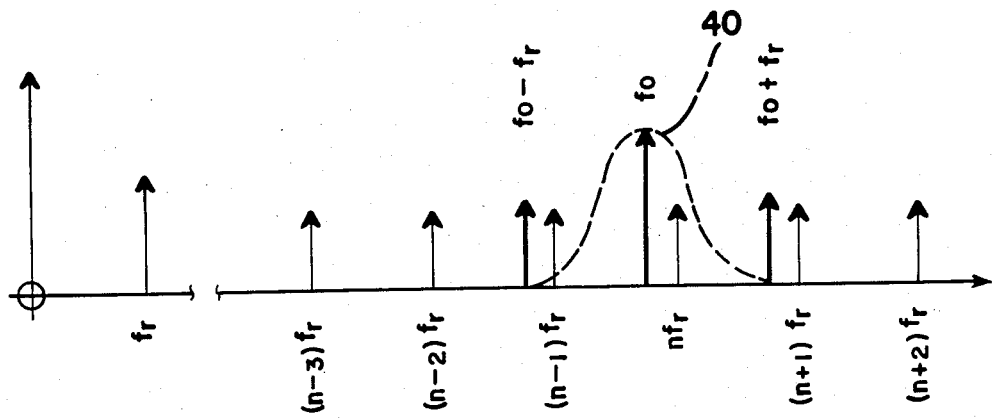
FIG. 2 is a frequency spectrum to illustrate the operation of the oscillator.

Due to the non-linear characteristic of the Gunn diode 26, the reference oscillator signal will produce a number of harmonics, some of which are shown in the frequency spectrum of FIG. 2, namely those at $(n-3)f_r$, $(n-2)f_r$, $(n-1)f_r$, $nf_r$, $(n+1)f_r$, and $(n+2)f_r$. Only the component nearest the resonance frequency $f_o$ of the microwave source 12, namely the component at $nf_r$, lies within the pass band of the microwave cavity and has any appreciable power. The pass band of the microwave oscillator is indicated diagrammatically by the dotted line 40 in FIG. 2.

Furthermore, the reference oscillator signal will attempt to modulate the microwave energy to produce upper and lower side bands, the side bands closest to the microwave source frequency $f_o$ being those at $f_o-f_r$ and $f_o+f_r$. Both these spectral components however lie outside the pass band of the microwave cavity and therefore have no significant power.

Through self mixing action of the Gunn diode, an IF signal having a frequency:

$$f_{IF} = |nf_r - f_o|$$

is produced, amplified in the IF amplifier 18 and fed to the frequency discriminator 20. The frequency discriminator produces an output signal which varies in accordance with the IF frequency. This output signal is fed via the loop filter 22 to terminal 38 of the varactor 28, to control the frequency of the microwave source. The frequency lock loop is effective to keep the IF frequency, and thus the RF frequency, substantially constant. In other words, the frequency stability of the microwave source is determined by the frequency stability of the reference oscillator 14.

It is known that Gunn diodes are noisy devices. Much of the noise output of the Gunn diode 26 can be suppressed by making use of a narrow band IF amplifier 18. However, with a narrow band IF amplifier 18 there is the risk that, upon switch-on of the oscillator 10, the IF appearing at terminal 30 will fall outside the pass band of the IF amplifier, and the oscillator will fail to lock. To overcome this difficulty, the oscillator 10 may be provided with a ramp generator 42 whose output can be superimposed upon the output of the loop filter 22 via an electronic switch 44. The oscillator 10 is further provided with a detector 46 for detecting an IF signal at the output of the IF amplifier 18, the detector being operative to close the electronic switch 44 in the absence of an IF signal and to open the switch when an IF signal is present. Thus, if the IF at the terminal 30 upon switch-on falls outside the pass band of the IF amplifier 18, the ramp generator 42 is switched in circuit to sweep the resonant frequency $f_o$ of the source 12, and thus the IF frequency, through a range of frequencies. As soon as the IF frequency falls within the pass band of the IF amplifier 18, the switch 44, in response to the detector 46, operates to disconnect the ramp generator 42 from the frequency lock loop. The gain of the frequency lock loop is sufficient to maintain lock after disconnection of the ramp generator 42.

It will be appreciated that the oscillator 10 may be provided with a phase lock instead of a frequency lock loop. In that event the IF signal (or a signal derived therefrom by frequency multiplication, division, subtraction and/or addition) in phase compared with the reference oscillator signal (or a signal derived therefrom by frequency multiplication, division, subtraction and/or addition) and an output signal corresponding in magnitude to the phase difference utilised to control the frequency of the microwave source.

Figure 3:
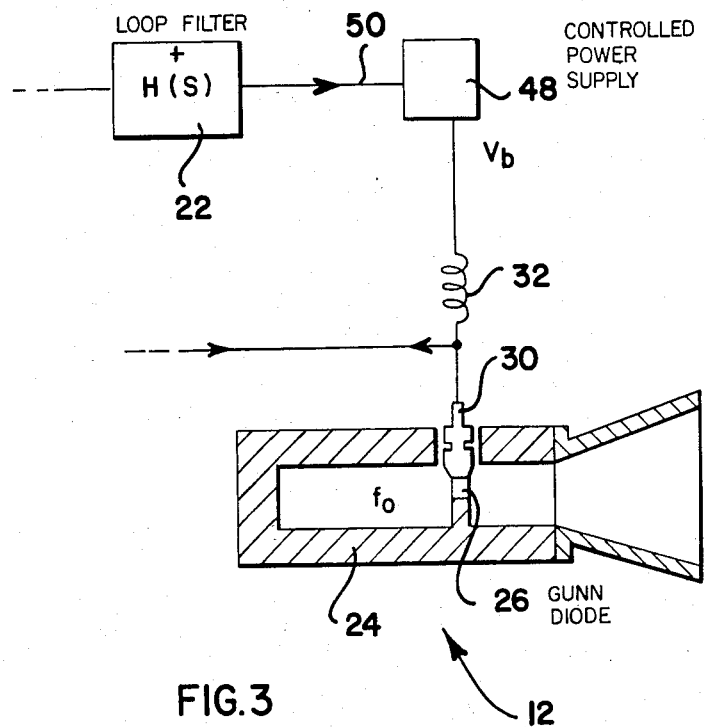
FIG. 3 shows a modification of the oscillator of FIG. 1.

In a modification of the embodiment described above, the varactor 28 is omitted and frequency control of the source 12 provided by controlling the bias voltage $V_b$ of the Gunn diode 26. This modification is illustrated in FIG. 3, where reference numeral 48 designates a controlled power supply for providing the Gunn diode 26 with a controlled bias voltage $V_b$. In this embodiment the output of the loop filter 22 is connected to control input 50 of the power supply 48. The remainder of the circuit is similar to that illustrated in FIG. 1.

The oscillators described above are particularly suitable for generating frequency stable RF energy at frequencies of greater than 2.5 GHz, where the use of digital frequency dividers connected directly to the RF output is not feasible. Moreover, the invention provides a particularly cheap solution to the problem of frequency control in a microwave oscillator, since no expensive microwave components need to be added to an existing microwave oscillator to obtain the desired results.

What is claimed is:

1. A frequency stable RF oscillator, which comprises:
    a variable frequency RF source for converting power from a power supply to RF energy, the RF source including an active element with a non-linear characteristic, and a power supply terminal for connecting the active element to the power supply;
    a frequency stable reference oscillator whose output is coupled to the RF source via the power supply terminal for causing harmonic mixing, in said active element, of the reference oscillator output with the RF energy;
    IF circuitry having its input coupled to the RF source via the power supply terminal and being responsive to the difference frequency between the frequency of the RF source and the second or higher harmonic of the frequency of the reference oscillator; and
    control means operable in response to the IF circuitry to control the frequency of the RF source.

2. An RF oscillator as claimed in claim 1, wherein said active element is a two-terminal negative resistance device.

3. An RF oscillator as claimed in claim 2, wherein the two-terminal negative resistance device is a Gunn diode.

4. An RF oscillator as claimed in claim 1, wherein said control means comprises means for establishing a frequency lock loop.

5. An RF oscillator as claimed in claim 4, wherein the variable frequency RF source comprises a varactor for providing the source with frequency variability, the control means being operable to control the frequency of the source by controlling the bias of the varactor.

6. An RF oscillator as claimed in claim 5, which further comprises a signal generator which is operative to superimpose a sweep signal on said bias until the frequency of the RF source is locked to that of the reference oscillator.

7. An RF oscillator as claimed in claim 4, which further comprises a variable power supply for providing said active element with a variable bias, and wherein the control means is operable to control the frequency of the RF source by controlling the bias of said active element.

8. An RF oscillator as claimed in claim 7, which further comprises a signal generator which is operative to superimpose a sweep signal on said bias until the frequency of the RF source is locked to that of the reference oscillator.

9. A method of generating frequency stable RF energy, which method comprises:
    causing a variable frequency RF source to generate RF energy from power supplied by a power supply, the RF source including an active element with a non-linear characteristic and having a power supply terminal whereby the active element is connected to the power supply;
    generating a frequency stable reference signal;
    impressing the reference signal on the RF source via the power supply terminal, thereby to generate an IF signal having a frequency equal to the difference frequency between the frequency of the RF source and the second or higher harmonic of the frequency of the reference signal; and utilizing the IF signal to control the frequency of the RF source.

10. A method as claimed in claim 9, wherein the IF signal is utilized to control the frequency of the RF source in a frequency lock loop.

* * * * *